(12) United States Patent
Xue et al.

(10) Patent No.: US 9,786,583 B2
(45) Date of Patent: Oct. 10, 2017

(54) POWER SEMICONDUCTOR PACKAGE DEVICE HAVING LOCKING MECHANISM, AND PREPARATION METHOD THEREOF

(71) Applicant: Alpha and Omega Semiconductor Incorporated, Sunnyvale, CA (US)

(72) Inventors: Yan Xun Xue, Los Gatos, CA (US); Hamza Yilmaz, Gilroy, CA (US); Yueh-Se Ho, Sunnyvale, CA (US); Jun Lu, San Jose, CA (US); De Mei Gong, Shanghai (CN)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 15/169,623

(22) Filed: May 31, 2016

(65) Prior Publication Data

US 2016/0379917 A1    Dec. 29, 2016

Related U.S. Application Data

(62) Division of application No. 14/754,662, filed on Jun. 29, 2015, now Pat. No. 9,397,029.

(51) Int. Cl.
*H01L 21/00* (2006.01)
*H01L 23/495* (2006.01)
(Continued)

(52) U.S. Cl.
CPC .... *H01L 23/49562* (2013.01); *H01L 21/4825* (2013.01); *H01L 21/565* (2013.01);
(Continued)

(58) Field of Classification Search
CPC .......... H01L 2224/80357; H01L 2224/48091; H01L 2224/48247; H01L 2224/16;
(Continued)

(56) References Cited

U.S. PATENT DOCUMENTS 5,288,667 A * 2/1994 Taruya ................ H01L 21/4842
257/E23.044
9,041,172 B1 * 5/2015 Niu .................... H01L 23/49503
257/676

(Continued)

FOREIGN PATENT DOCUMENTS

JP        04170054 A  *  6/1992
JP        2560909 B2  * 12/1996 ............. H01L 24/97

*Primary Examiner* — Teresa M Arroyo
(74) *Attorney, Agent, or Firm* — Chen-Chi Lin

(57) ABSTRACT

A power semiconductor package device and a method of preparation the device are disclosed. The package device includes a die paddle, a first pin, a second pin, and a semiconductor chip attached to the die paddle. A first electrode, a second electrode and a third electrode of the semiconductor chip are connected to the first pin, the second pin and the die paddle respectively. A plastic package body covers the semiconductor chip, the die paddle, the first pin and the second pin. The first pin and the second pin are located near two adjacent corners of the plastic package body. The bottom surface and two side surfaces of each of the first pin and the second pin are exposed from the plastic package body. Locking mechanisms are constructed to prevent the first pin and the second pin from falling off the power semiconductor package device during a manufacturing cutting process. Portions of the first pin, portions of the second pin, and portions of the plastic package body can be cut off. Therefore, the size of the power semiconductor package device is reduced.

5 Claims, 8 Drawing Sheets

(51) Int. Cl.
*H01L 21/78* (2006.01)
*H01L 21/48* (2006.01)
*H01L 21/56* (2006.01)
*H01L 23/498* (2006.01)
*H01L 23/31* (2006.01)
*H01L 23/00* (2006.01)

(52) U.S. Cl.
CPC .......... *H01L 21/78* (2013.01); *H01L 23/3114* (2013.01); *H01L 23/4952* (2013.01); *H01L 23/49503* (2013.01); *H01L 23/49541* (2013.01); *H01L 23/49548* (2013.01); *H01L 23/49568* (2013.01); *H01L 23/3107* (2013.01); *H01L 23/49811* (2013.01); *H01L 24/16* (2013.01); *H01L 24/29* (2013.01); *H01L 24/32* (2013.01); *H01L 24/48* (2013.01); *H01L 24/49* (2013.01); *H01L 24/81* (2013.01); *H01L 24/83* (2013.01); *H01L 24/85* (2013.01); *H01L 24/92* (2013.01); *H01L 24/97* (2013.01); *H01L 2224/0603* (2013.01); *H01L 2224/0807* (2013.01); *H01L 2224/16* (2013.01); *H01L 2224/16245* (2013.01); *H01L 2224/293* (2013.01); *H01L 2224/29139* (2013.01); *H01L 2224/29294* (2013.01); *H01L 2224/3207* (2013.01); *H01L 2224/32245* (2013.01); *H01L 2224/48091* (2013.01); *H01L 2224/48247* (2013.01); *H01L 2224/49176* (2013.01); *H01L 2224/49177* (2013.01); *H01L 2224/73253* (2013.01); *H01L 2224/73265* (2013.01); *H01L 2224/80345* (2013.01); *H01L 2224/80357* (2013.01); *H01L 2224/80897* (2013.01); *H01L 2224/81* (2013.01); *H01L 2224/83801* (2013.01); *H01L 2224/83805* (2013.01); *H01L 2224/92242* (2013.01); *H01L 2224/92247* (2013.01); *H01L 2224/97* (2013.01); *H01L 2924/00014* (2013.01); *H01L 2924/181* (2013.01); *H01L 2924/18301* (2013.01)

(58) Field of Classification Search
CPC ....... H01L 2924/01079; H01L 2924/14; H01L 2924/01029; H01L 2924/01078; H01L 2924/15311; H01L 23/49811; H01L 21/482; H01L 21/78; H01L 2924/00014; H01L 2924/00; H01L 2924/014; H01L 2924/207; H01L 2924/18301; H01L 2224/97; H01L 2224/81; H01L 2224/29139; H01L 2224/29294; H01L 2224/293; H01L 2224/3207; H01L 2224/32245; H01L 2224/49176; H01L 2224/49177; H01L 2224/73265; H01L 2224/80345; H01L 2224/80897; H01L 2224/81897; H01L 2224/83897; H01L 2224/83801; H01L 2224/83805; H01L 2224/92247; H01L 2224/92242; H01L 2224/45015; H01L 2224/45099; H01L 2224/49171; H01L 2224/49175; H01L 2224/83; H01L 2224/85; H01L 2224/0807; H01L 2224/16245; H01L 2224/73253; H01L 21/4825; H01L 21/565; H01L 23/3107; H01L 23/3114; H01L 23/49503; H01L 23/4952; H01L 23/49541; H01L 23/49548; H01L 23/49562; H01L 23/49568; H01L 24/16; H01L 24/29; H01L 24/32; H01L 24/48; H01L 24/49; H01L 24/81; H01L 24/83; H01L 24/85; H01L 24/92; H01L 24/97; H01L 31/0487; H01L 31/049; H01L 31/18; B32B 2270/00; B32B 2457/12; B32B 27/08; B32B 27/32; Y02E 10/50
USPC ......... 257/676, 690, 692, 697; 438/110, 111, 438/112
See application file for complete search history.

(56) References Cited

U.S. PATENT DOCUMENTS

| | | | | |
|---|---|---|---|---|
| 9,397,029 | B1* | 7/2016 | Xue | H01L 23/49541 |
| 2005/0173793 | A1* | 8/2005 | Rohrmoser | H01L 21/561 257/724 |
| 2011/0260305 | A1* | 10/2011 | Saboco | H01L 23/4952 257/670 |
| 2012/0025298 | A1* | 2/2012 | Ho | H01L 23/3114 257/329 |
| 2012/0025361 | A1* | 2/2012 | Ito | H01L 23/047 257/676 |
| 2014/0306328 | A1* | 10/2014 | Mikado | H01L 23/28 257/666 |

* cited by examiner

POWER SEMICONDUCTOR PACKAGE DEVICE HAVING LOCKING MECHANISM, AND PREPARATION METHOD THEREOF

CROSS-REFERENCE TO RELATED APPLICATIONS

This Patent Application is a Divisional Application of a pending application Ser. No. 14/754,662 filed on Jun. 29, 2015. The application Ser. No. 14/754,662 is patented as U.S. Pat. No. 9,397,029 on Jul. 19, 2016 (after the filing date of the present Patent Application). The Disclosure made in the patent application Ser. No. 14/754,662 is hereby incorporated by reference.

FIELD OF THE INVENTION

This invention relates generally to a power semiconductor package device. More particularly, the present invention relates to a power switch having a reduced-size and a method of fabricating the same.

BACKGROUND OF THE INVENTION

In a conventional power switching system, the voltage is modulated by an electronic switch to generate a final output voltage with a small ripple. In one example, the electronic switch is a power semiconductor package device. Current technology requires the power semiconductor package device with a reduced size to fit in a small mounting space. For example, FIG. 1A shows a Dual Flat Non-Leaded (DFN) package device having a dimension of about 1.0 mm×0.6 mm (length L×width W). The DFN package device has a gate pad G, a source pad S and a drain pad D. The size of the gate pad G and the size of the source pad S are relatively small. A space E between the gate pad G and the source pad S is generally only about 0.35 mm. The length B of the drain pad D is about 0.5 mm. To fit into the dimension of about 1.0 mm×0.6 mm, the gate pad G and the source pad S are usually located very close to edges of the package device. A cutting process is performed to separate individual package devices from a semiconductor wafer. The cutting process may introduce size variation to the individual package devices. FIG. 1B shows a defected DFN package device resulting from a cutting offset. The gate pad G of the defected DFN package device is biased to an edge of the defected DFN package device and causes one side surface of the gate pad G exposed. The gate pad G may easily fall off. In a more severe cutting offset, part of the gate pad G may be cut off. Each pad needs to carry a certain amount of current or voltage.

The space E between the gate pad G and the source pad S needs to be larger than a predetermined value to assure safety of the device by avoiding coupling and lapping of the gate pad G and the source pad S with soldering paste during the process of mounting the DFN package device on a circuit board.

SUMMARY OF THE INVENTION

In examples of the present disclosure, a bottom surface and two side surfaces of each of a gate pin and a source pin are exposed from a plastic package body of a power semiconductor package device. Locking mechanisms are constructed to prevent the gate pin and the source pin from falling off the power semiconductor package device during a manufacturing cutting process. Portions of the gate pin, portions of the source pin, and portions of the plastic package body can be cut off. Therefore, the size of the power semiconductor package device is reduced.

BRIEF DESCRIPTION OF THE DRAWINGS

FIG. 5A, FIG. 5B, FIG. 5C, FIG. 5D-1, FIG. 5D-2, FIG. 5D-3, and FIG. 5E are schematic diagrams showing a preparation process of a package device in the present disclosure.

DETAILED DESCRIPTION OF THE INVENTION

Figure 1A:
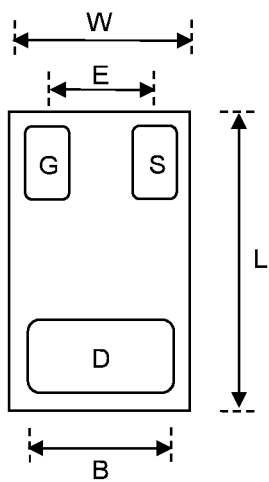
FIG. 1A and FIG. 1B show top views of power devices in prior art.
Figure 1B:
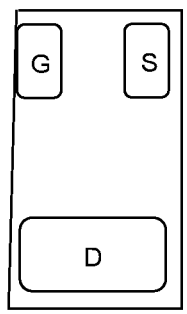
Figure 2:
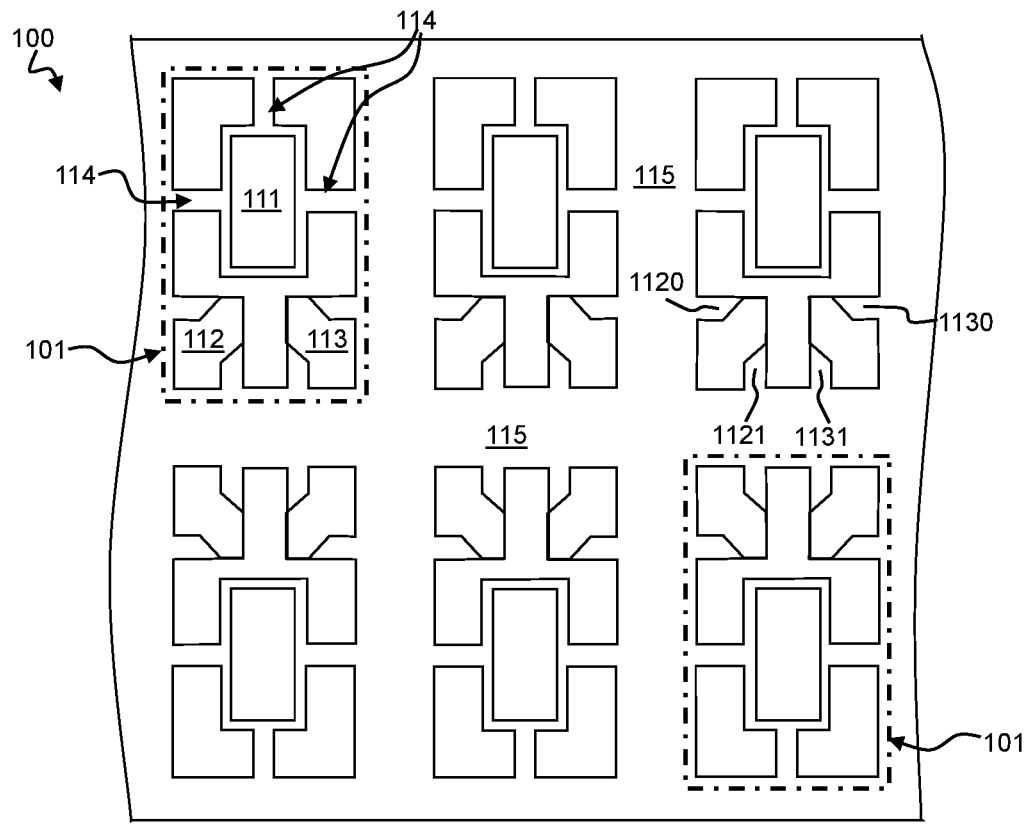
FIG. 2 is a bottom view of a lead frame used for fabricating package devices in the present disclosure.
Figure 3:
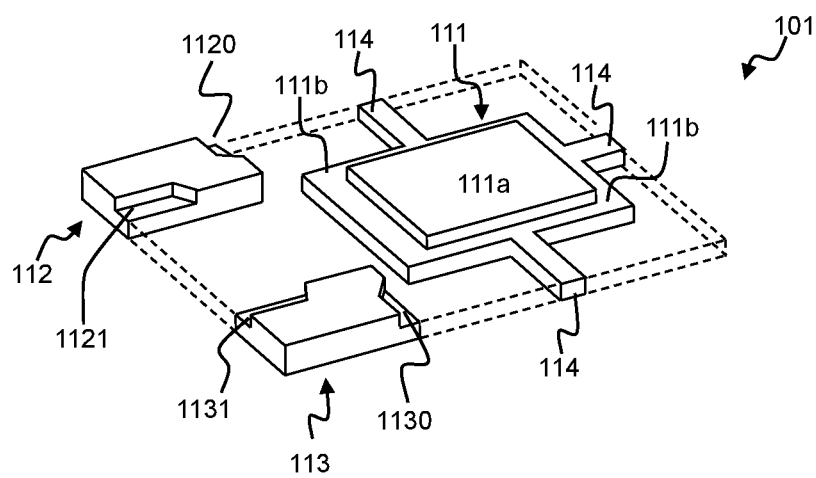
FIG. 3 is a perspective view of a lead frame unit in the lead frame of FIG. 2.

FIG. 2 is a bottom view of a portion of a metal lead frame 100. The lead frame 100 includes a plurality of lead frame units 101 framed by dotted lines. Each lead frame unit 101 includes a die paddle 111, a first pin 112 and a second pin 113. The die paddle 111, the first pin 112 and the second pin 113 are separated from each other. The die paddle 111, the first pin 112 and the second pin 113 may have shapes of cuboids or cubes. In addition to traditional packaging processes, as shown in FIG. 3, a partial etching or stamping/embossing process is performed at a bottom surface of each of the lead frame unit 101 to form a recess area 111b surrounding the processed bottom surface 111a and the peripheral edges of the die paddle 111.

Figure 4:
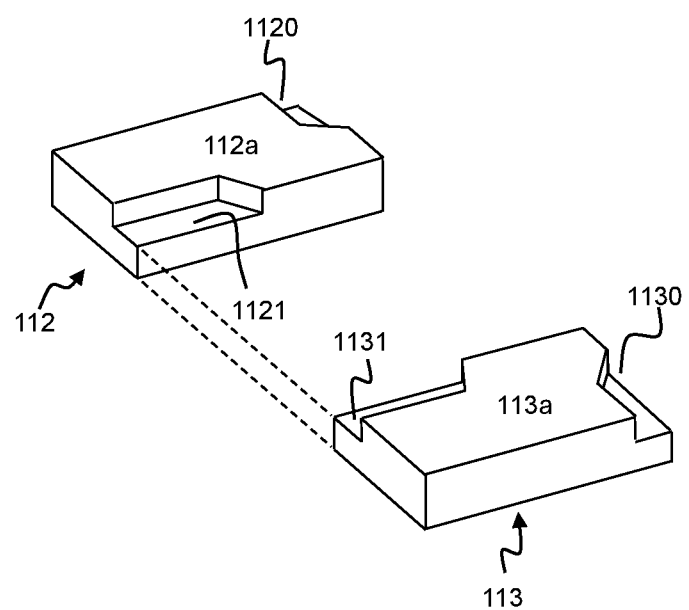
FIG. 4 is a perspective view of a first pin and a second pin of the lead frame unit of FIG. 3.

In FIG. 4, a recess area 1120 and a recess area 1121 are formed in two opposite corners at a bottom surface 112a of the first pin 112. A recess area 1130 and a recess area 1131 are formed in two opposite corners at a bottom surface 113a of the second pin 113. In examples of the present disclosure, the longitudinal direction of the strip-like recess area 1120 is perpendicular to the longitudinal direction the strip-like recess area 1121 of the first pin 112. The longitudinal direction of the strip-like recess area 1130 is perpendicular to the longitudinal direction of the strip-like recess area 1131 of the second pin 113. In FIG. 2 and FIG. 3, the first pin 112 and the second pin 113 are directly connected to a horizontal or vertical support bar 115 of the lead frame 100. The die paddle 111 is connected to the horizontal or vertical support bar 115 of the lead frame 100 via a plurality of connecting bands 114. The plurality of connecting bands 114 support and hold the lead frame units 101 in place.

Figure 5A:
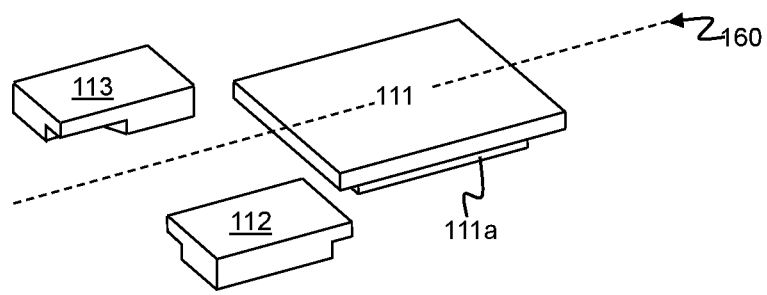

Only an individual lead frame unit is shown in FIG. 5A for clarity. The lead frame unit in FIG. 5A is still in a wafer. A cutting process has not been applied to the wafer yet. FIG. 5A is an inclined top view of the lead frame unit 101 of FIG. 3. In examples of the present disclosure, the die paddle 111, the first pin 112 and the second pin 113 are located at three vertices of a triangle respectively. The first pin 112 and the second pin 113 are symmetric with respect to a symmetrical line 160 of the die paddle 111.

Figure 5B:
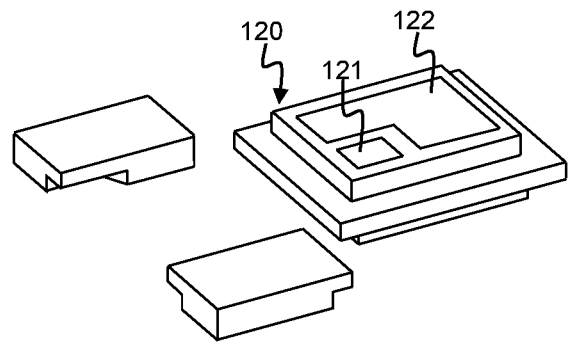

In FIG. 5B, a standard die bonding step is applied to the wafer. A semiconductor chip 120 is attached to the die paddle 111 of the lead frame unit 101 by a standard die bonding technology. The semiconductor chip 120 may be a vertical power MOSFET including a first electrode 121 and a second electrode 122. The first electrode 121 may be a gate electrode. The second electrode may be a source electrode. The first electrode 121 and the second electrode 122 are electrically insulated from each other and are located at a top surface of the semiconductor chip 120. A third electrode (not shown) is located at a bottom surface of the semiconductor chip 120. The third electrode may be a drain electrode. In one example, the semiconductor chip 120 may be attached to the top surface of the die paddle 111 via a soldering paste, a conductive silver or a conductive bonding material. In another example, the bottom surface of the semiconductor chip 120 may be mounted on the top surface of the die paddle 111 via a eutectic bonding process or a welding process so that the third electrode at the bottom surface of the semiconductor chip 120 is electrically connected to the die paddle 111.

Figure 5C:
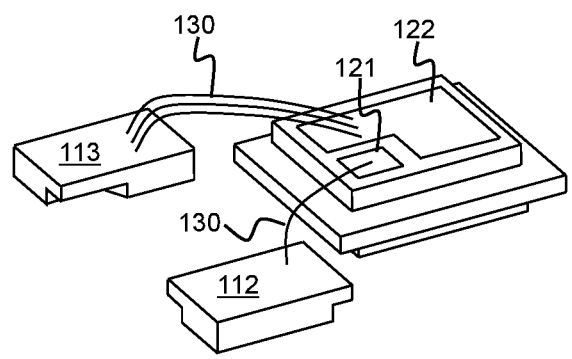

In FIG. 5C, the first electrode 121 is electrically connected to the top surface of the first pin 112 via a bonding wire 130. The second electrode 122 is electrically connected to the top surface of the second pin 113 via another set of bonding wires 130. The bonding wires 130 may be replaced by a conduction band or a metal clip. Although FIG. 5C shows a conventional package mode with bonding wires, a Flip Chip packaging technology may be applied to the lead frame 100 (not shown). By applying a Flip Chip technology, a semiconductor chip with all first, second and third electrodes on its top surface is flipped and attached to the lead frame unit 101. The first electrode is attached to the first pin 112. The second electrode is attached to the second pin 113. The third electrode is attached to the die paddle 111 of the lead frame unit 101.

Figures 1, 5D:
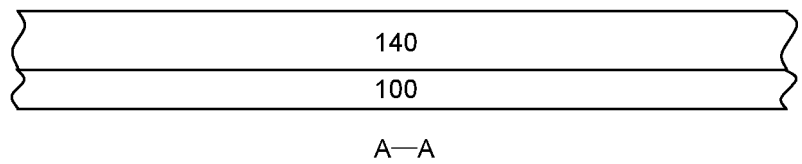
Figures 2, 5D:
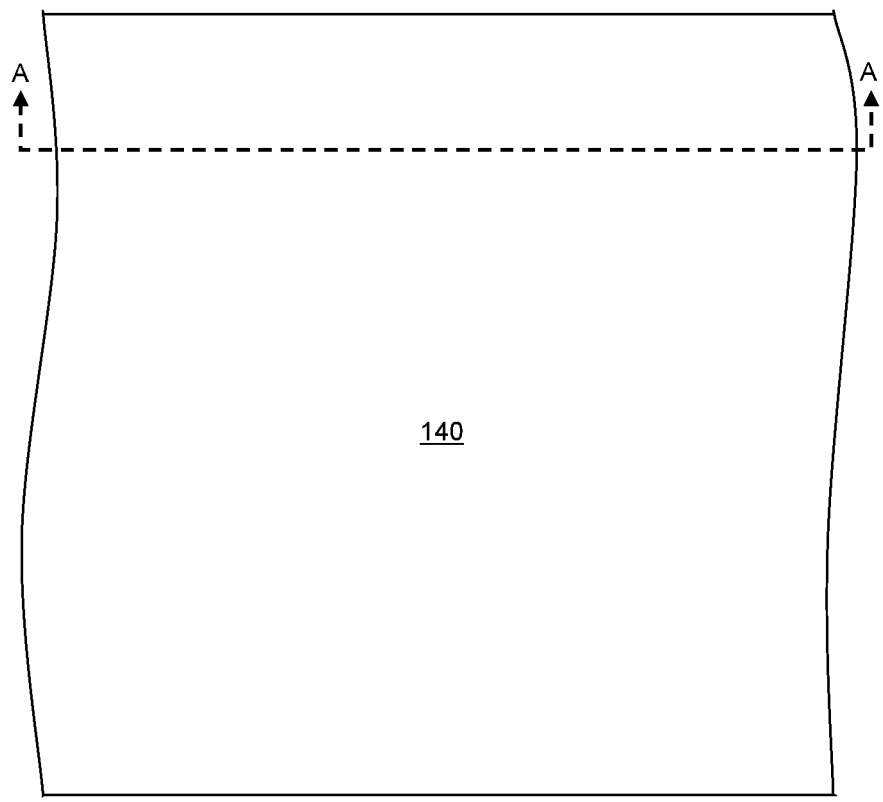
Figures 3, 5D:
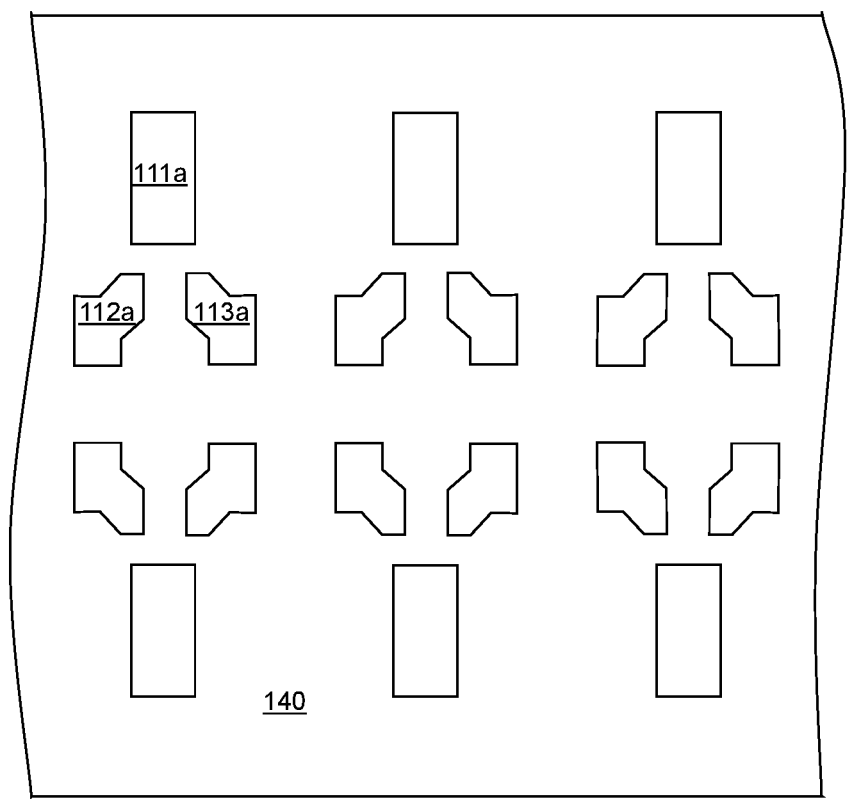

FIG. 5D-1 is a cross-sectional view of the lead frame 100. The semiconductor chips and bonding wires (not shown) are covered by a plastic package layer 140 by applying a standard plastic packaging step. FIG. 5D-2 is a top view of the plastic package layer 140. FIG. 5D-3 is a bottom view of the lead frame 100 after coated by the plastic package layer 140.

In FIG. 5D-1, a molding compound is deposited so as to form a plastic package layer 140 covering the lead frame 100, the semiconductor chips 120 and the bonding wires 130. In one example, the molding compound is epoxy resin. In FIG. 5D-3, the bottom surface 112a of the first pin 112, the bottom surface 113a of the second pin 113 and the bottom surface 111a of the die paddle 111 of the lead frame unit 101 are exposed from the bottom surface of the plastic package layer 140. The molding compound is filled into the recess area 111b at the bottom surface of the die paddle 111 under a molding pressure. The molding compound is filled into the recess area 1120 and the recess area 1121 at the bottom surface 112a of the first pin 112. The molding compound is filled into the recess area 1130 and the recess area 1131 at the bottom surface 113a of the second pin. The filling of the molding compound into the recess areas are for mold locking purpose. A standard package cutting technology is then applied to cut through the wafer from the plastic package layer 140 to the lead frame 100. Cutting processes are applied along predetermined cutting lines between adjacent lead frame units. Each lead frame unit 101 is cut off and separated from the lead frame 100. A plurality of plastic package bodies 141 are formed via cutting the plastic package layer 140. Each plastic package body 141 covers one lead frame unit 101. The connecting bands 114 are cut off, so that the die paddle 111, the first pin 112 and the second pin 113 of each lead frame unit 101 are separated from the lead frame 100.

Figure 5E:
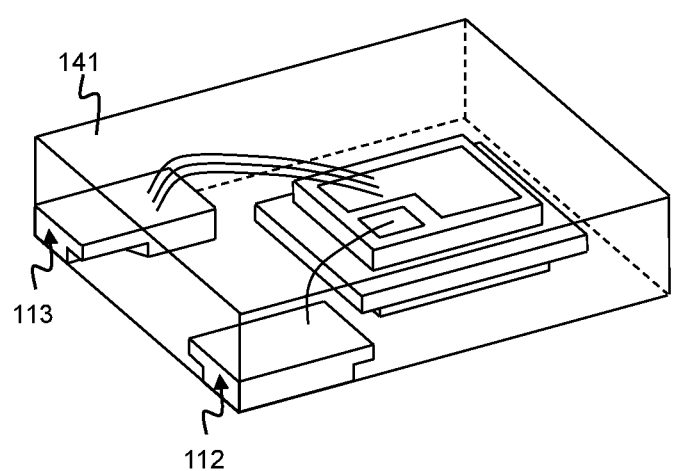

In one example as shown in FIG. 2 and FIG. 3, the first pin 112 and the second pin 113 are cut exactly at their edges connecting with a support bar 115 of the lead frame 100. No portions of the first pin 112 and no portions of the second pin 113 are cut off so as to form a good package device as shown in FIG. 5E. The recess area 1120 and the recess area 1121 at the bottom surface 112a of the first pin 112 and the recess area 1130 and the recess area 1131 at the bottom surface 113a of the second pin remain unchanged (without being cut off). A portion of the plastic package body 141 is embedded in the recess areas to hold the first pin 112 and the second pin 113 in place.

Figure 6A:
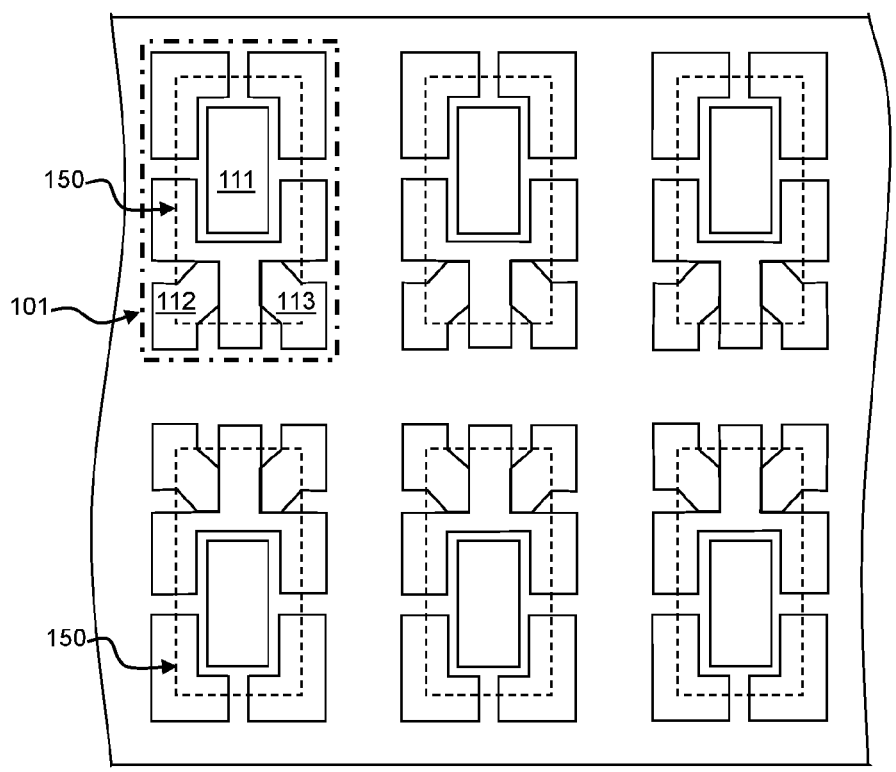
FIG. 6A-FIG. 6D are schematic diagrams showing another preparation process of a package device in the present disclosure.
Figure 6B:
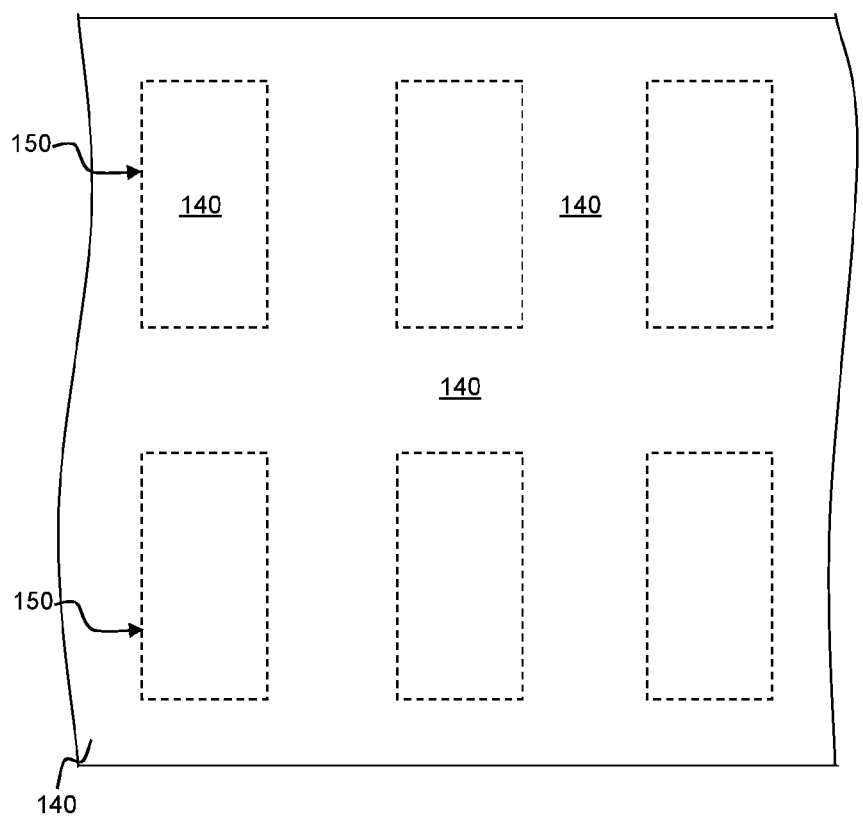
Figure 6C:
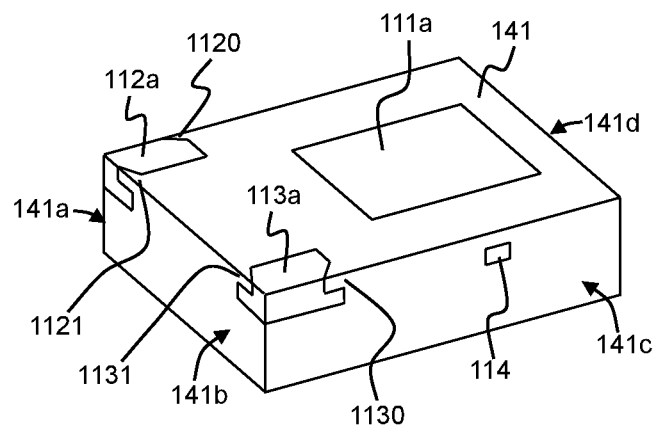

In another example, as shown in FIGS. 6A-6C, a process of fabricating a package device smaller than the package device of FIG. 5E is provided. FIG. 6A is a bottom view of the lead frame 100 after forming the plastic package layer 140. FIG. 6B shows a top view of the lead frame 100 covered by the plastic package layer 140. FIG. 6C is an inclined bottom view of an individual final package device. When the standard package cutting step is applied to the wafer, an edge portion of the first pin 112 and an edge portion of the second pin 113 are cut off. In FIGS. 6A-6B, the plastic package layer 140 and the lead frame 100 are cut along a dotted line 150. The connecting bands 114 are cut off. An L-shaped portion at the edge of the first pin 112 and an L-shaped portion at the edge of the second pin 113 are cut off. The size of the first pin 112, the size of the second pin 113, the size of the plastic package body 141, and the size of the final package device are reduced. The package device of FIG. 6C is smaller than the package device of FIG. 5E.

Figure 6D:
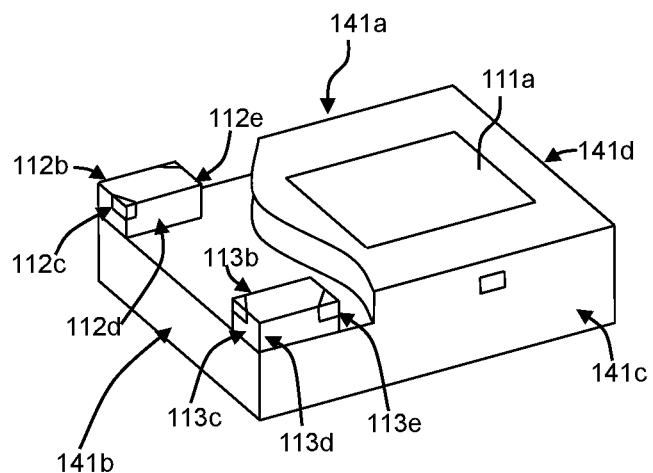

To perform a successful cutting step, the locations of the first pin 112 and the second pin 113 are very important. In FIG. 6C, the first pin 112 and the second pin 113 are located at two adjacent corners of the plastic package body 141. FIG. 6D shows an inclined bottom view of the final package device of FIG. 6C with a part of the plastic package body 141 removed to provide a better view of the first pin 112 and the second pin 113 in the final package device.

In FIG. 6C, the side surfaces 141a, 141b, 141c, and 141d of the plastic package body 141 are formed by cutting the plastic package layer 140. The side surface 141a is opposing the side surface 141c. The side surface 141b is opposing the side surface 141d. In FIG. 6D, two adjacent side surfaces 112b and 112c are formed by cutting the first pin 112. The edge between the side surfaces 112b and 112c overlaps with the edge between the two adjacent side surfaces 141a and 141b of the plastic package body 141. The side surface 112b of the first pin 112 is exposed and the side surface 112c of the first pin 112 is exposed. Similarly, two adjacent side surfaces 113c and 113d are formed by cutting the second pin 113. The edge between the side surfaces 113c and 113d overlaps with the edge between the two adjacent side surfaces 141b and 141c of the plastic package body 141. The side surface 113c of the second pin 113 is exposed and the side surface 113d of the second pin 113 is exposed. In examples of the present disclosure, the cutting surfaces of the first pin 112, the second pin 113, and the plastic package body 141 shown in FIG. 6C and FIG. 6D distinguish the package device of the present disclosure from the traditional quad flat no lead (QFN) package device.

The recess area 1120 and the recess area 1121 are located at two diagonal corners of the bottom surface 112a of the first pin 112 respectively. The recess area 1130 and the recess area 1131 are located at two diagonal corners of the bottom surface 113a of the second pin 113 respectively. The molding compound is filled in the recess areas in the plastic packaging step. In the present disclosure, in the cutting step as shown in FIGS. 6C-6D, the recess area 1120 is located at the corner between the unexposed side surface 112e of the first pin 112 and the exposed side surface 112b of the first pin 112. The recess area 1121 is located at the corner between the unexposed side surface 112d of the first pin 112 and the exposed side surface 112c of the first pin 112. Part of the plastic package body 141 is embedded into the recess area 1120 and recess area 1121 for mold locking. Similarly, the recess area 1130 is located at the corner between the unexposed side surface 113e of the second pin 113 and the exposed side surface 113d of the second pin 113. The recess area 1131 is located at the corner between the unexposed side surface 113b of the second pin 113 and the exposed side surface 113c of the second pin 113. Part of the plastic package body 141 is embedded into the recess area 1130 and recess area 1131 for mold locking.

In the final package device shown in FIG. 6C, the first pin 112 and the second pin 113 may provide a better thermal dissipation path due to more exposed side surfaces. However, the first pin 112 and the second pin 113 are located at corners of the plastic package body 141 and may easily fall off from the plastic package body 141. In the cutting step, an external force is applied to the first pin 112 and the second pin 113. It may cause the first pin 112 and the second pin 113 to fall off from the corners of the plastic package body 141. The chance to fall off increases when the size of the package device becomes smaller and smaller. In examples of the present disclosure, the locking modes hold the first pin 112 and the second pin 113 in place and prevent them from falling off. The package device of the present disclosure includes the recess area 1120 and the recess area 1121 at the two corners of the bottom surface 112a of the first pin 112. It includes the recess area 1130 and the recess area 1131 at the two corners of the bottom surface 113a of the second pin 113. A portion of the plastic package body 141 is filled in the recess areas, so that the plastic package body 141 tightly holds the first pin 112 and the second pin 113. The first pin 112 and the second pin 113 will not fall off during the cutting process. It overcomes the issues existed in conventional technology. Smaller size of the package device can be achieved.

Those of ordinary skill in the art may recognize that modifications of the embodiments disclosed herein are possible. For example, the number of lead frame units in a lead frame may vary. Other modifications may occur to those of ordinary kill in this art, and all such modifications are deemed to fall within the purview of the present invention, as defined by the claims.

The invention claimed is:

1. A method of fabricating package devices, the method comprising the steps of:
   providing a lead frame comprising a plurality of lead frame units, wherein each lead frame unit comprises a die paddle, a first pin and a second pin and wherein the first pin and the second pin are located adjacent to the die paddle;
   attaching each of a plurality of semiconductor chips to a respective die paddle of the plurality of lead frame units;
   connecting a first electrode, a second electrode and a third electrode of each of the plurality of semiconductor chips to the respective first pin, the respective second pin and the respective die paddle of the plurality of lead frame units;
   forming a plastic package layer covering the plurality of semiconductor chips and the lead frame; and
   performing a cutting process comprising:
      cutting the plastic package layer so as to form a plurality of plastic package bodies; and
      cutting the lead frame so as to form a plurality of package devices;
   wherein the first pin and the second pin of each of the package devices are located at two adjacent corners of each of the package devices;
   wherein a bottom surface, a first side surface and a second side surface of the first pin of each of the package devices are exposed from the plastic package body of each of the package devices;
   wherein a bottom surface, a first side surface and a second side surface of the second pin of each of the package devices are exposed from the plastic package body of each of the package devices;
   wherein each die paddle of the plurality of package devices has a bottom surface with a recess area;
   wherein a first area enclosed by an outer perimeter of the recess area of the bottom surface of said each die paddle is greater than a second area of a bottom surface of a respective semiconductor chip of the plurality of semiconductor chips;
   wherein the recess area of each die paddle surrounds peripheral edges of each die paddle;
   wherein a portion of a respective plastic package body of the plurality of plastic package bodies is embedded in the recess area of each die paddle; and
   wherein the bottom surface of each die paddle is exposed from the respective plastic package body of the plurality of plastic package bodies.

2. A method of fabricating package devices, the method comprising the steps of:
   providing a lead frame comprising a plurality of lead frame units, wherein each lead frame unit comprises a die paddle, a first pin and a second pin and wherein the first pin and the second pin are located adjacent to the die paddle;
   attaching each of a plurality of semiconductor chips to a respective die paddle of the plurality of lead frame units;
   connecting a first electrode, a second electrode and a third electrode of each of the plurality of semiconductor chips to the respective first pin, the respective second pin and the respective die paddle of the plurality of lead frame units;
   forming a plastic package layer covering the plurality of semiconductor chips and the lead frame; and
   performing a cutting process comprising:
      cutting the plastic package layer so as to form a plurality of plastic package bodies; and
      cutting the lead frame so as to form a plurality of package devices;
   wherein the first pin and the second pin of each of the package devices are located at two adjacent corners of each of the package devices;
   wherein a bottom surface, a first side surface and a second side surface of the first pin of each of the package devices are exposed from the plastic package body of each of the package devices;
   wherein a bottom surface, a first side surface and a second side surface of the second pin of each of the package devices are exposed from the plastic package body of each of the package devices;
   wherein the bottom surface of the first pin of each of the plurality of package devices has a first recess area and a second recess area;

wherein the first recess area and the second recess area of each of the plurality of package devices are located at two diagonal corners of the first pin respectively;

wherein a first end of the first recess area of each of the plurality of package devices is flush with the respective first exposed side surface of the first pin;

wherein a second end of the first recess area of each of the plurality of package devices opposite the first end of the first recess area is flush with an unexposed side surface of the first pin;

wherein a first end of the second recess area of each of the plurality of package devices is flush with the respective second exposed side surface of the first pin;

wherein a second end of the second recess area of each of the plurality of package devices opposite the first end of the second recess area is flush with another unexposed side surface of the first pin; and wherein respective portions of the plastic package body of the plurality of plastic package bodies are embedded in the first and second recess areas of the first pin of each of the plurality of package devices to form a locking mechanism.

3. The method of claim 2, wherein the step of performing a cutting process further comprises:
cutting off an edge portion of the first pin of each of the plurality of package devices; and
cutting off an edge portion of each of the plurality of plastic package bodies.

4. A method of fabricating package devices, the method comprising the steps of:
providing a lead frame comprising a plurality of lead frame units, wherein each lead frame unit comprises a die paddle, a first pin and a second pin and wherein the first pin and the second pin are located adjacent to the die paddle;
attaching each of a plurality of semiconductor chips to a respective die paddle of the plurality of lead frame units;
connecting a first electrode, a second electrode and a third electrode of each of the plurality of semiconductor chips to the respective first pin, the respective second pin and the respective die paddle of the plurality of lead frame units;
forming a plastic package layer covering the plurality of semiconductor chips and the lead frame; and
performing a cutting process comprising:
cutting the plastic package layer so as to form a plurality of plastic package bodies; and
cutting the lead frame so as to form a plurality of package devices;

wherein the first pin and the second pin of each of the package devices are located at two adjacent corners of each of the package devices;

wherein a bottom surface, a first side surface and a second side surface of the first pin of each of the package devices are exposed from the plastic package body of each of the package devices;

wherein a bottom surface, a first side surface and a second side surface of the second pin of each of the package devices are exposed from the plastic package body of each of the package devices;

wherein the bottom surface of the second pin of each of the plurality of package devices has a first recess area and a second recess area;

wherein the first recess area and the second recess area of each of the plurality of package devices are located at two diagonal corners of the second pin respectively;

wherein a first end of the first recess area of each of the plurality of package devices is flush with the respective first exposed side surface of the second pin;

wherein a second end of the first recess area of each of the plurality of package devices opposite the first end of the first recess area is flush with an unexposed side surface of the second pin;

wherein a first end of the second recess area of each of the plurality of package devices is flush with the respective second exposed side surface of the second pin;

wherein a second end of the second recess area of each of the plurality of package devices opposite the first end of the second recess area is flush with another unexposed side surface of the second pin; and wherein respective portions of the plastic package body of the plurality of plastic package bodies are embedded in the first and second recess areas of the second pin of each of the plurality of package devices to form a locking mechanism.

5. The method of claim 4, wherein the step of performing a cutting process further comprises:
cutting off an edge portion of the second pin of each of the plurality of package devices; and
cutting off an edge portion of each of the plurality of plastic package bodies.

* * * * *